(12) United States Patent
McCormick et al.

(10) Patent No.: US 7,665,505 B2
(45) Date of Patent: Feb. 23, 2010

(54) CONTROLLING A POSITION OF A FLEXIBLE COVERING

(75) Inventors: Gregory Radcliffe McCormick, Painswick (GB); Michael Mosley, Cheltenham (GB)

(73) Assignee: Hunter Douglas Industries BV, El Rotterdam (NL)

(*) Notice: Subject to any disclaimer, the term of this patent is extended or adjusted under 35 U.S.C. 154(b) by 0 days.

(21) Appl. No.: 11/972,859

(22) Filed: Jan. 11, 2008

(65) Prior Publication Data

US 2008/0210390 A1    Sep. 4, 2008

(30) Foreign Application Priority Data

Jan. 13, 2007  (GB) ................. 0700706.5

(51) Int. Cl.
A47G 5/02 (2006.01)
E06B 9/56 (2006.01)

(52) U.S. Cl. .......... 160/238; 160/291; 160/309

(58) Field of Classification Search .......... 160/305, 160/307, 313, 319, 323.1, 291, 170, 171, 160/191, 192, 193, 201, 314, 370.22
See application file for complete search history.

(56) References Cited

U.S. PATENT DOCUMENTS

| | | | |
|---|---|---|---|
| 122,288 A | | 12/1871 | Smith |
| 280,249 A | * | 6/1883 | Shaw .......... 160/292 |
| 377,489 A | | 2/1888 | Logan |
| 794,937 A | * | 7/1905 | Hopkins .......... 160/279 |
| 1,931,166 A | * | 10/1933 | Mccloud .......... 160/209 |
| 2,008,000 A | * | 7/1935 | Brunst et al. .......... 160/209 |
| 2,041,221 A | * | 5/1936 | Brunst .......... 160/191 |
| 2,064,470 A | * | 12/1936 | Heckman .......... 160/40 |
| 2,420,301 A | * | 5/1947 | Cusumano .......... 160/170 |
| 2,543,711 A | * | 2/1951 | Schultz .......... 160/312 |
| 2,674,306 A | * | 4/1954 | Prieto .......... 160/313 |
| 2,842,198 A | * | 7/1958 | Prieto .......... 160/313 |
| 3,146,825 A | * | 9/1964 | Briggs, Jr. et al. .......... 160/191 |
| 3,452,480 A | | 7/1969 | Foster |
| 4,535,830 A | | 8/1985 | Appel et al. |
| 4,697,304 A | * | 10/1987 | Overgard .......... 16/198 |
| 4,760,622 A | * | 8/1988 | Rohrman .......... 16/196 |
| 4,914,780 A | * | 4/1990 | Rogers et al. .......... 16/193 |
| 5,054,162 A | | 10/1991 | Rogers |
| 5,464,052 A | * | 11/1995 | Wieczorek et al. .......... 160/23.1 |
| 5,482,100 A | * | 1/1996 | Kuhar .......... 160/170 |
| 5,530,991 A | * | 7/1996 | deNormand et al. .......... 16/198 |

(Continued)

FOREIGN PATENT DOCUMENTS

DE    1 509 896    8/1969

(Continued)

Primary Examiner—Katherine W Mitchell
Assistant Examiner—Jaime F Cardenas-Garcia
(74) Attorney, Agent, or Firm—Dorsey & Whitney LLP (57) ABSTRACT

A control apparatus for positioning and counterbalancing an amount of flexible blind material wound onto or unwound from a rotatable shaft of a windable covering such as a blind. The apparatus includes a main body and a variable torque device, at least partially fitted within the main body, having means of achieving a variable torque to prevent rotation of the shaft due to a variable weight of blind material hanging from the shaft in any position between a wound position and an unwound position of the blind material defining full travel of the windable covering.

6 Claims, 7 Drawing Sheets

U.S. PATENT DOCUMENTS

| | | | |
|---|---|---|---|
| 5,930,865 A * | 8/1999 | Mihalcheon | 16/197 |
| 5,975,186 A * | 11/1999 | Day | 160/321 |
| 6,003,584 A | 12/1999 | Weinreich | |
| 6,283,192 B1 * | 9/2001 | Toti | 160/170 |
| 6,325,131 B1 * | 12/2001 | Dekker et al. | 160/170 |
| 6,467,128 B1 * | 10/2002 | Damani | 16/197 |
| 6,505,668 B1 | 1/2003 | Fun | |
| 6,536,503 B1 | 3/2003 | Anderson et al. | |
| 6,644,373 B2 | 11/2003 | Palmer | |
| 6,802,105 B2 * | 10/2004 | Polowinczak et al. | 16/198 |
| 6,843,302 B2 * | 1/2005 | Nijs | 160/321 |
| 6,957,683 B2 * | 10/2005 | Toti | 160/170 |
| 6,968,884 B2 * | 11/2005 | Anderson et al. | 160/170 |
| 7,069,621 B2 * | 7/2006 | Malek | 16/194 |
| 7,387,150 B2 * | 6/2008 | Liu | 160/321 |
| 2002/0033240 A1 * | 3/2002 | Toti | 160/170 |
| 2003/0213096 A1 * | 11/2003 | Annes et al. | 16/216 |
| 2004/0163210 A1 * | 8/2004 | Malek | 16/197 |
| 2004/0237256 A1 * | 12/2004 | Lutfallah | 16/197 |
| 2005/0139331 A1 * | 6/2005 | O'Malley | 160/191 |
| 2005/0139332 A1 * | 6/2005 | O'Malley | 160/191 |
| 2005/0150615 A1 | 7/2005 | Bousson | |
| 2005/0283944 A1 * | 12/2005 | Wu | 16/194 |
| 2008/0093034 A1 * | 4/2008 | Anderson et al. | 160/170 |
| 2008/0223532 A1 * | 9/2008 | Auger | 160/292 |

FOREIGN PATENT DOCUMENTS

| | | |
|---|---|---|
| DE | 100 48 296 A1 | 4/2002 |
| DE | 101 63 741 A1 | 7/2003 |
| EP | 0 417 270 | 3/1991 |
| EP | 1 571 289 A1 | 9/2005 |
| EP | 1 681 435 A2 | 7/2006 |
| FR | 2 751 024 | 1/1998 |

* cited by examiner

CONTROLLING A POSITION OF A FLEXIBLE COVERING

CROSS REFERENCE TO RELATED APPLICATION

This application claims priority to Great Britain patent application No. 0700706.5, filed on 13 Jan. 2007, and such application is hereby incorporated by reference as if fully disclosed herein.

BACKGROUND OF THE INVENTION

The present invention relates to a control apparatus and a method of controlling a position of a hanging flexible covering such as a blind.

Various arrangements for controlling flexible coverings such as blinds exist. A common arrangement includes a torsion spring that is fitted within a rotatable cylinder around which the blind material is wound. As the blind is unfurled, the torsion spring is turned, creating a reverse direction force that is intended to compensate for the weight of the curtain material hanging from the cylinder. However, in practice, the use of a torsion spring and the necessary gearing required to maintain a desired blind position is often problematic. The force applied by the torsion spring is only in balance with the force resulting from the weight of the hanging portion of the blind for a relatively small range of the travel of the blind between its fully wound and fully unwound positions. Thus, the effort required by a user to fully wind/unwind the blind can be substantial, especially when larger blinds are used. Alternatives to this type of torsion spring mechanism have been tried, e.g. electric motors, but these tend to be expensive and/or complex.

Embodiments of the present invention are intended to address at least some of the problems associated with such conventional arrangements.

BRIEF SUMMARY OF THE INVENTION

According to the present invention, there is provided a control apparatus for positioning and counterbalancing an amount of flexible blind material wound onto or unwound from a rotatable shaft of a windable covering such as a blind. The apparatus includes: a main body and a variable torque device, at least partially fitted within the main body, having means of achieving a variable torque to prevent rotation of the shaft due to a variable weight of blind material hanging from the shaft in any position between a wound position and an unwound position of the blind material defining full travel of the windable covering.

The variable torque device can include a first fixed housing, a movable carriage and at least one constant force device.

One, or both, of the first fixed housing and the movable carriage cab be in the form of a removable cartridge that can be readily replaced by another cartridge from a set of cartridges having different types of constant force devices that provide a force of a different magnitude.

The constant force device can be a constant force spring.

The control apparatus can further include means of matching relative movement between the carriage and the first fixed housing to the travel of the windable covering.

The means of matching can include a second fixed housing, a flexible elongate member that is adapted to be wound and unwound about an axis and a spool.

The flexible elongate member can have a length that matches the unwound length of the flexible covering material within 10%.

The flexible elongate member can have a thickness that matches the thickness of the flexible covering material within 10%.

The flexible elongate member can be a cable having a diameter in accordance with the thickness of the flexible covering.

The control apparatus can further include a control device configured to allow a user to rotate the shaft, for adjusting a position of the flexible covering.

The control apparatus can include a rotatable collar attaching to the tubular cylindrical shaft.

The cylindrical shaft can be hollow and can accommodate the main body.

The control apparatus can further include a pin for temporarily preventing rotation of the shaft prior to and during installation.

According to the present invention, there may also be provided a roller blind including the control apparatus.

According to a first aspect of the present invention there is provided apparatus 100 adapted to control a position of a hanging flexible covering, the apparatus including:

a shaft 108 rotatable with respect to a structure 111 to which, in use, the apparatus is fixed, the shaft being configured to be attached to a flexible covering 110;

a control device 109, 109A configured to allow a user to rotate the shaft, thereby adjusting a position of the flexible covering, and a variable torque device 116, 118, 124, 107, 144 configured to limit or prevent rotation of the shaft due to a weight of a portion of the flexible covering adjusted to hang from the shaft, the variable torque device producing a torque using a variable counter-balance whose weight varies in accordance with the weight of the hanging portion of the flexible covering.

The apparatus may be configured to adjust the position of the flexible covering between a fully wound state and a fully unwound state, with the variable torque device being configured to provide the counter-balance substantially equivalent to the effective weight of the flexible covering at any position between the fully wound state and the fully unwound state.

The variable torque device may include at least one component that uses a torque exerted on the shaft due to the weight of the hanging portion of the covering to produce the counter-balance. The variable torque device may variably increase/decrease an amount of a counter-balance material having a weight corresponding to the weight of the hanging portion of the flexible covering to produce the counter-balance. The amount of counter-balance material may be adjusted as a result of rotation of the shaft. The counter-balance material may comprise a flexible elongate member that is wound/unwound around an axis. A force resulting from the weight of the counter-balance material may be countered by a constant force device to exert the torque corresponding to the opposing torque on the shaft. The constant force device may comprise a constant force spring. The constant force device/spring may be at least partially fitted within the apparatus by means of a removable body, thus allowing for easy replacement of the carriage and device/spring with others that provide a force of a different magnitude.

A dimension of the flexible elongate member may correspond with a corresponding dimension of the flexible covering. For example, where the flexible elongate member comprises a wire, cable or the like, a diameter of the elongate member can correspond to a thickness of the flexible covering. A length of the wire, cable or the like may also correspond to a length of the flexible covering in its fully unwound state.

The variable torque device may be (at least) partially fitted within the shaft. The variable torque device may be partially fitted at one end of the shaft, and may be located adjacent the fixing component.

The apparatus may further include a component for preventing rotation of the shaft for assisting during installation of the apparatus/covering.

According to another aspect of the present invention there is provided a controllable hanging flexible covering including control apparatus substantially as described herein and a flexible covering.

According to yet another aspect of the present invention there is provided a method of installing a controllable hanging flexible covering, the method including:

attaching a flexible covering to the shaft of a control apparatus substantially as described herein;

fitting components selected to correspond to the flexible covering material in the apparatus, and fixing the apparatus to a structure.

According to yet another aspect of the invention there is provided a method of using control apparatus substantially as described herein to control a position of a hanging flexible covering, and/or a structure having the control apparatus installed on it.

Whilst the invention has been described above, it extends to any inventive combination of the features set out above or in the following description. Although illustrative embodiments of the invention are described in detail herein with reference to the accompanying drawings, it is to be understood that the invention is not limited to those precise embodiments. As such, many modifications and variations will be apparent to practitioners skilled in this art. Furthermore, it is contemplated that a particular feature described either individually or as part of an embodiment can be combined with other individually described features, or parts of other embodiments, even if the other features and embodiments make no mention of the particular feature. Thus, the invention extends to such specific combinations not already described.

BRIEF DESCRIPTION OF THE DRAWINGS

The invention may be performed in various ways, and, by way of example only, embodiments thereof will now be described, reference being made to the accompanying drawings, in which.

DESCRIPTION OF THE PREFERRED EMBODIMENTS

Referring to FIGS. 1 to 4, an example of an apparatus 100 for controlling the position of a flexible covering such as a roller blind is shown. The main body 102 of the apparatus comprises a generally cylindrical body having a cutaway portion that allows components to be fitted in an internal space/channel within the body. Although the main body 102 is shown as being circular in cross-section and similar in size/dimensions to a rotatable shaft that is fitted on the apparatus 100 (and will be described below), it will be appreciated that the body can take other shapes, e.g. a tube of square cross-section. The main body, as with other components of the apparatus, can be formed of any suitable material, e.g. metal or rigid plastics, and can be dimensioned to suit any particular application, e.g. having dimensions selected for convenient fitting adjacent the window/door/aperture across which the blind is to be fitted. An advantage of the apparatus described herein is that it can be formed so as to be significantly shorter than the width of the blind itself.

An operating spool/o-ring 104 is rotatably fitted to one end of the main body 102 by means of a central spindle 106. A rotatable ring-shaped collar 107 is fitted over the main body 102 near its opposite end. A tubular cylindrical shaft 108 (shown schematically using broken lines in FIG. 4 only) is fitted over the main body 102 and is attached to the operating spool 104, a further spool 109A (described below) and the rotatable collar 107. Thus, the components 104, 107 and 108 are rotatable relative to the inner body 102 and other fixed components of the apparatus 100. Attached to the shaft 108, e.g. by means of an adhesive or any other suitable direct or indirect fixing means, is the blind material 110 (shown partially using broken lines in FIG. 4 only). The blind 110 can be formed of any suitable flexible fabric or other material(s).

A control mechanism can take the form of a loop of chain 109 or the like that is fitted over a further spool 109A (shown schematically in FIG. 4 only) located beyond the operating spool 104. The further spool can include/be connected to means, e.g. a bracket (not shown), for fixing that end of the apparatus 100 to a structure such as a wall. Chains such as chain 109 are known means for adjusting blinds and work by rotating the further spool 109A and the shaft 108 (and other components) to which it is attached when a user pulls on a section of the chain. It will be understood that other operating devices, e.g. a rod pivotally connected to the further spool 109A, or a gearbox mechanism connected directly to an operating cable (described below), could be used instead of the flexible chain shown.

A portion of the rotatable collar 107 passes through an inner wall of a housing 114 that is fixed to the adjacent end of the main body 102. A plate 112 is attached to the outer end of the housing 114 in order to close it, thereby forming a box in which parts of the control apparatus can be fitted. Normally, the plate 112 will include apertures and/or fixing means, e.g. bolts, screws, brackets or the like, for connecting that end of the control apparatus to a structure, such as a wall of a building (an example of which is shown partially using broken lines at 111 in FIG. 4 only).

A first fixed spring housing component 116 is fitted within the channel of the main body 102. The first fixed housing 116 is generally circular in cross-section and includes two compartments. In each of the compartments one end of one of a pair of constant force springs 120A, 120B is fixed. In alternative embodiments another type of device that applies a constant force could be used, e.g. a hydraulic or pneumatic-based spring mechanism that can be preset at a selected tension. The other ends of both springs are connected to a bar located in a movable carriage component 118. The outer surface of the movable carriage 118 is similar in shape to the internal surface of the main body 102 so that the carriage 118 can slide within the channel in the main body. Such movement is limited by contact with other components located within the channel. A first pulley wheel 122 is rotatably fitted within the movable carriage 118. The first pulley wheel 122 includes two grooves.

Figure 1:
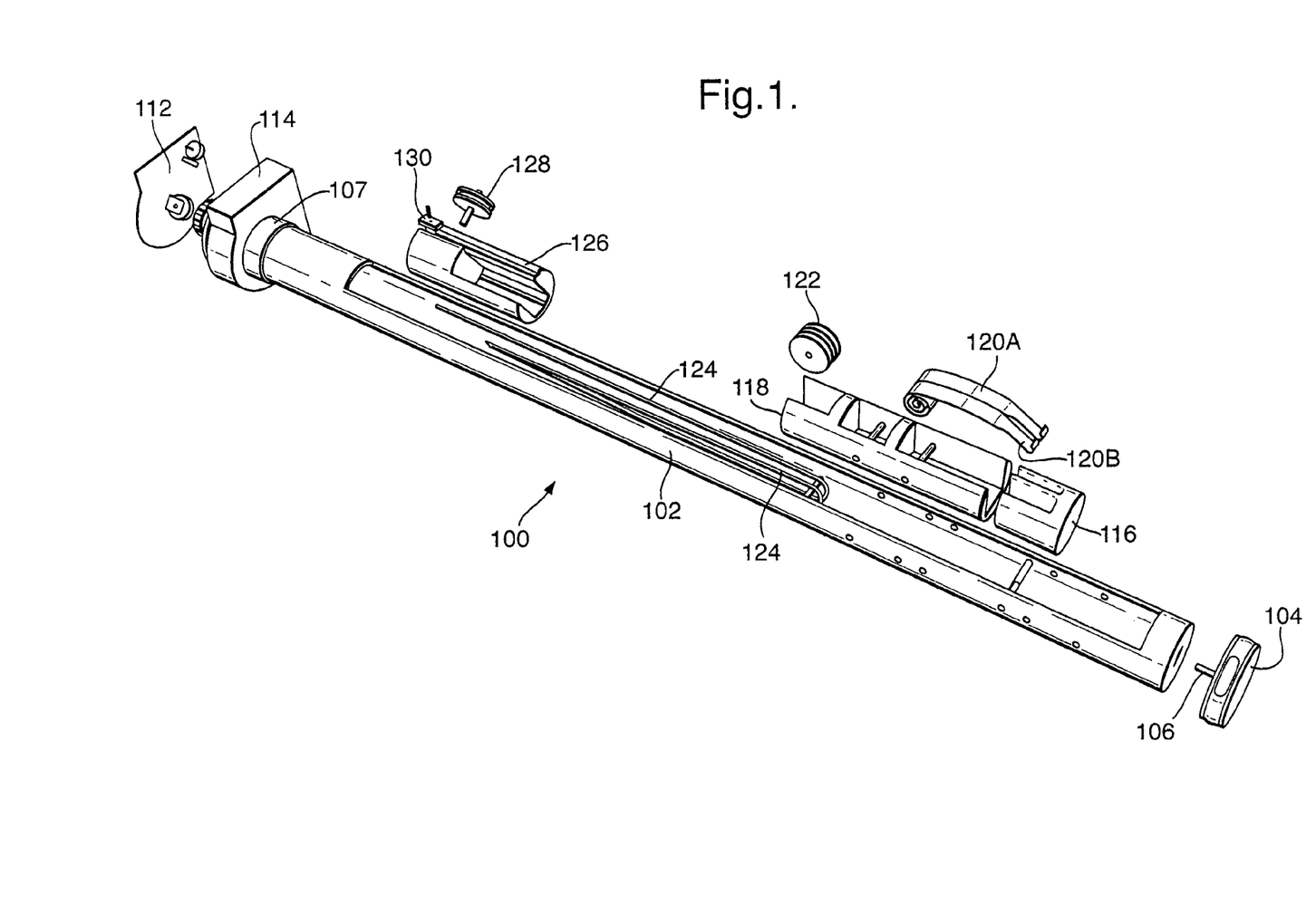
FIG. 1 is an exploded perspective view of components of an embodiment of the control apparatus.
Figure 2:
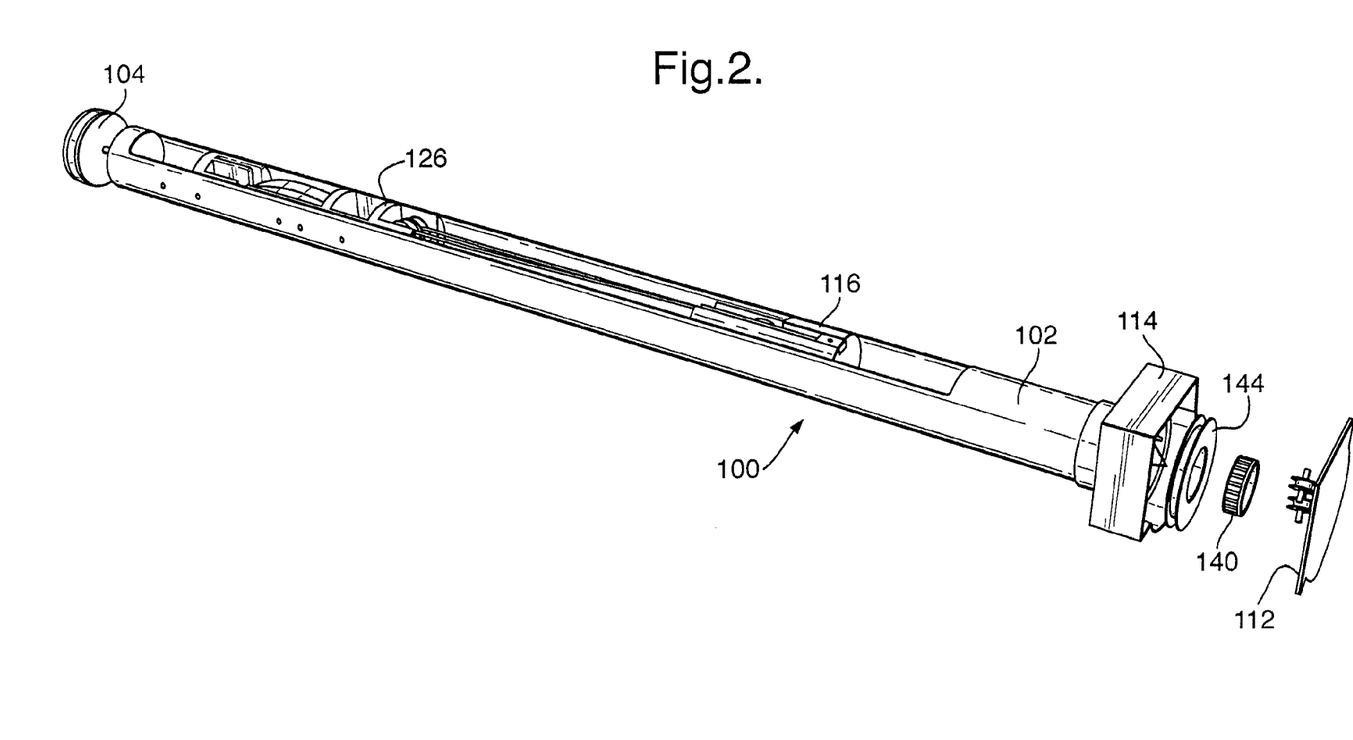
FIG. 2 is a partially exploded perspective view (rotated by around 180° with respect to FIG. 1) of the components.
Figure 3:
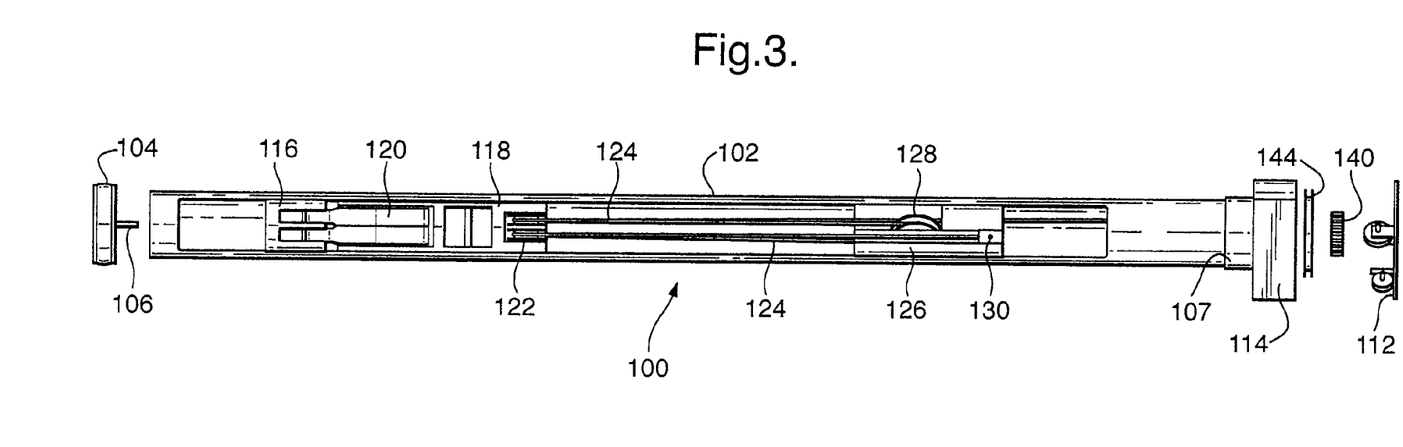
FIG. 3 is a plan view corresponding to FIG. 2.
Figure 4:
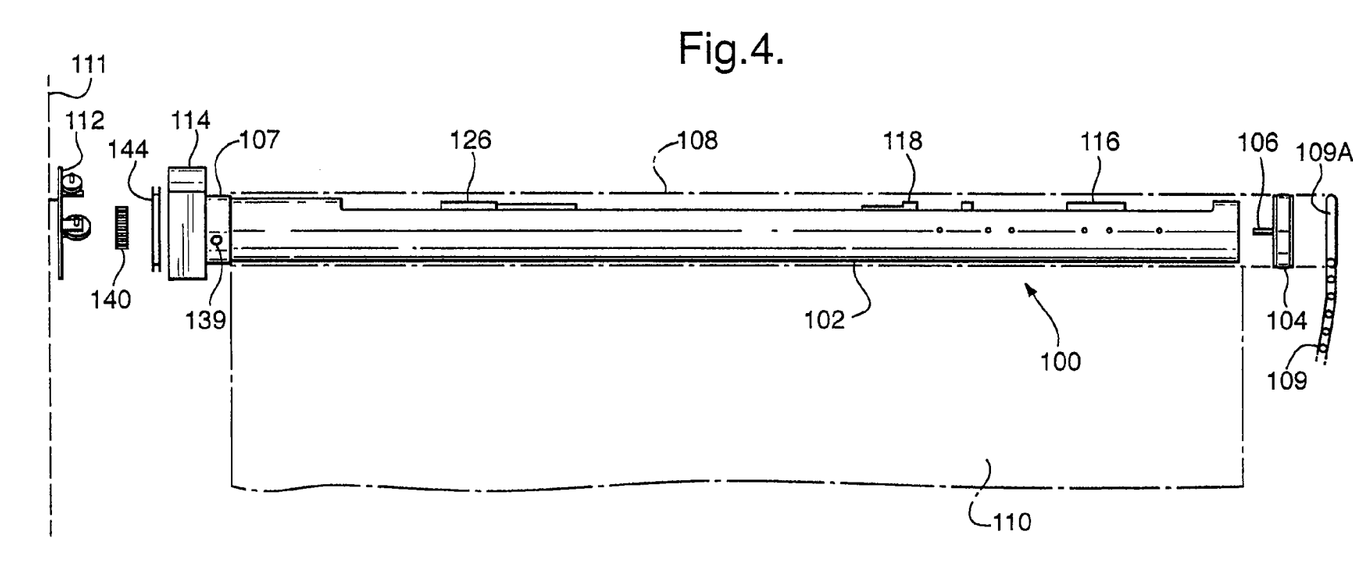
FIG. 4 is a side view corresponding to FIGS. 2 and 3.

Towards the opposite end of the main body 102 there is a second fixed spring housing component 126. FIGS. 2, 3 and 4 show the main body 102 with the carriage 118, the first 116 and second 126 spring housings and associated components fitted within the channel of the main body. A second pulley wheel 128 is rotatably mounted within the second fixed housing 126. The axis of the second pulley wheel 128 is tilted at an angle of around 20° with respect to the axis of the first pulley wheel 122. A cable clamp 130 is fitted adjacent an outer end of the second fixed housing 126, on its upper surface.

Figure 5:
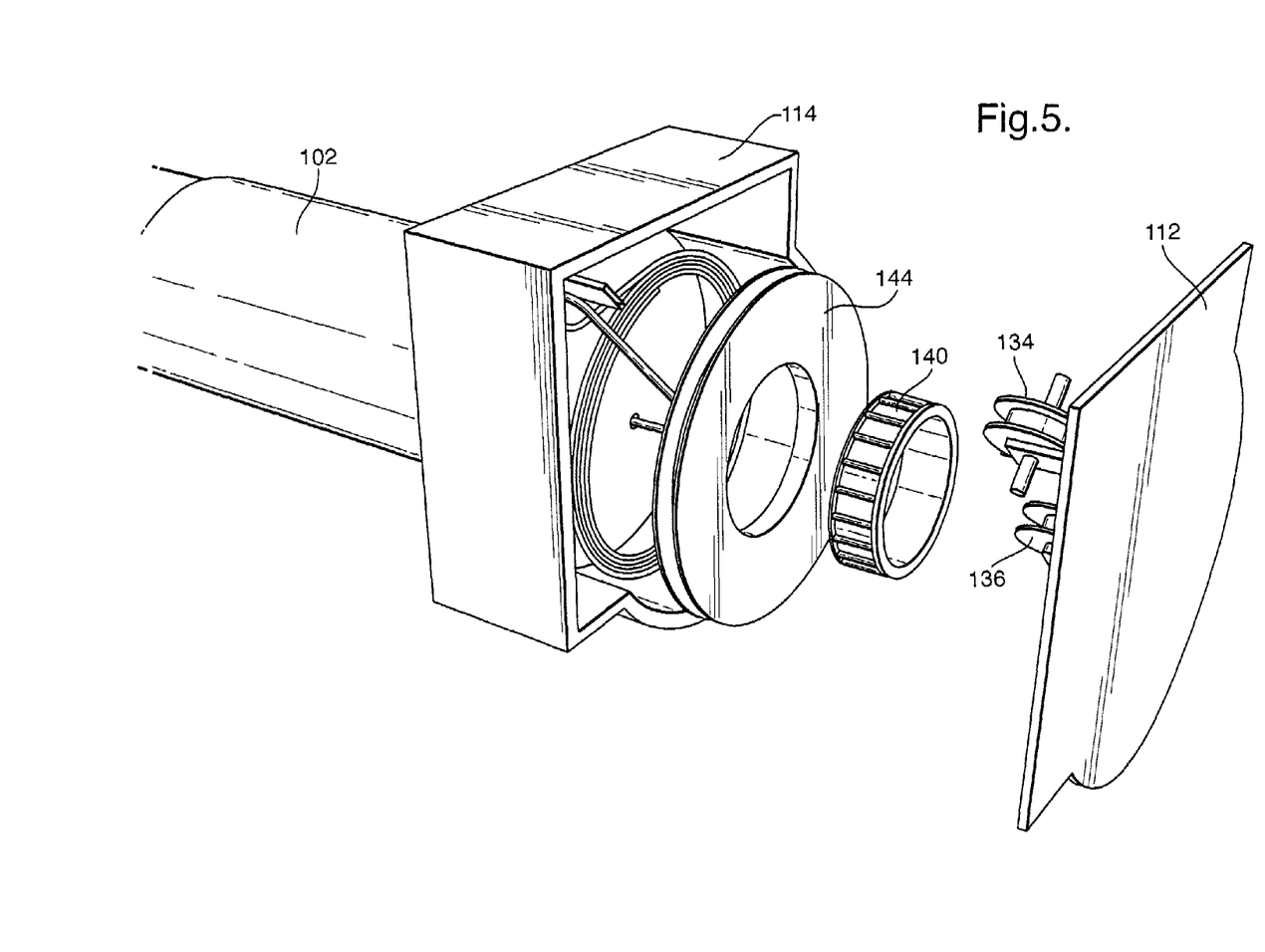
FIG. 5 is an exploded view detailing components located at one end of the apparatus.

Turning to FIG. 5, components that are fitted inside the end housing 114 are shown. The inner surface of the plate 112 is fitted with a third pulley wheel 134 that is located above a fourth pulley wheel 136. The axis of rotation of the third pulley wheel 134 is substantially perpendicular to the axis of the fourth pulley wheel 136. The housing 114 also includes a cable drum bearing 140 that is connected to the collar 107. The bearing 140 fits within a central aperture of a spool 144. The bearing 140 and spool are configured to rotate along with the outer collar 107.

Figure 6A:
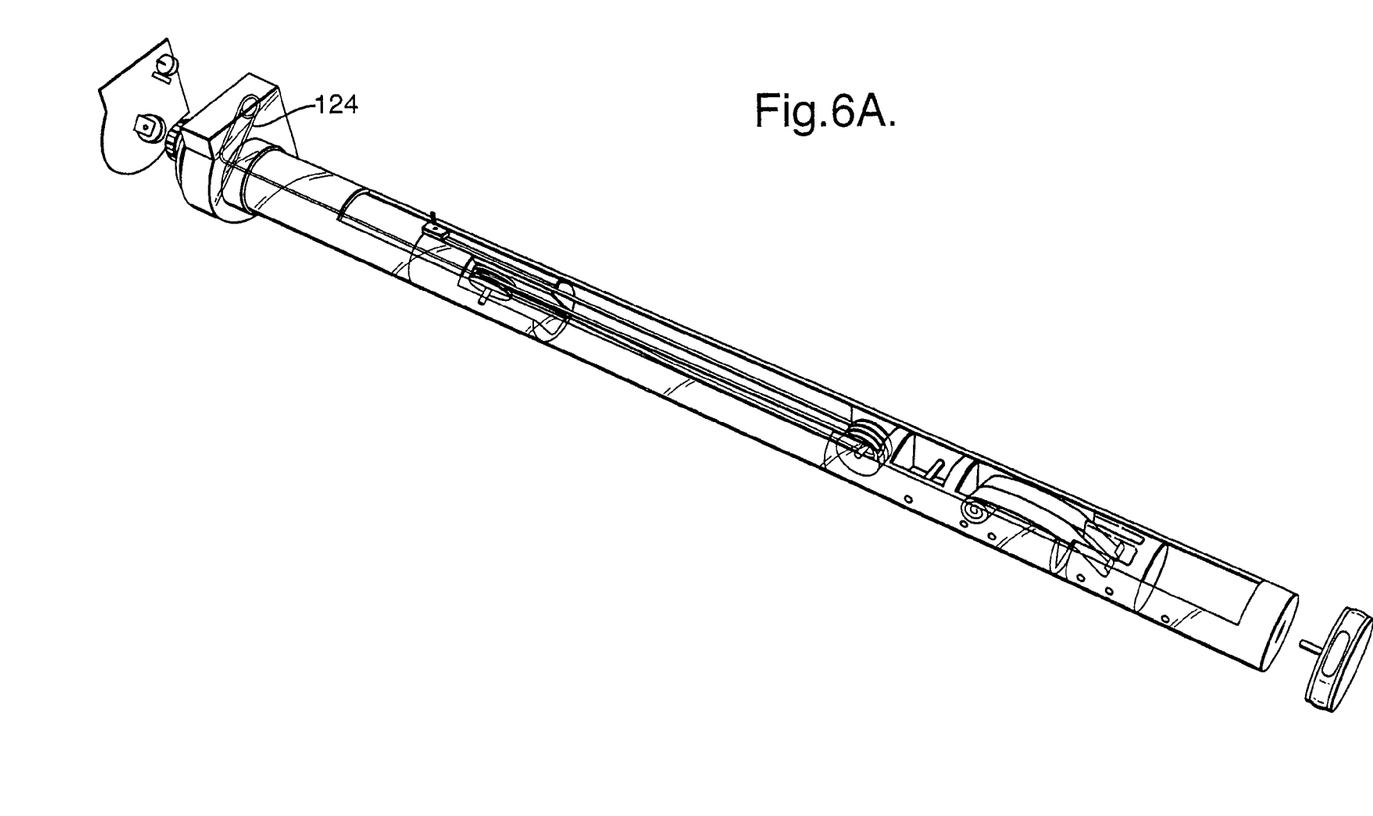
FIGS. 6A, 6B and 6C are partially transparent perspective, side and plan views, respectively, of the apparatus highlighting the path of a cable fitted within it.
Figure 6B:
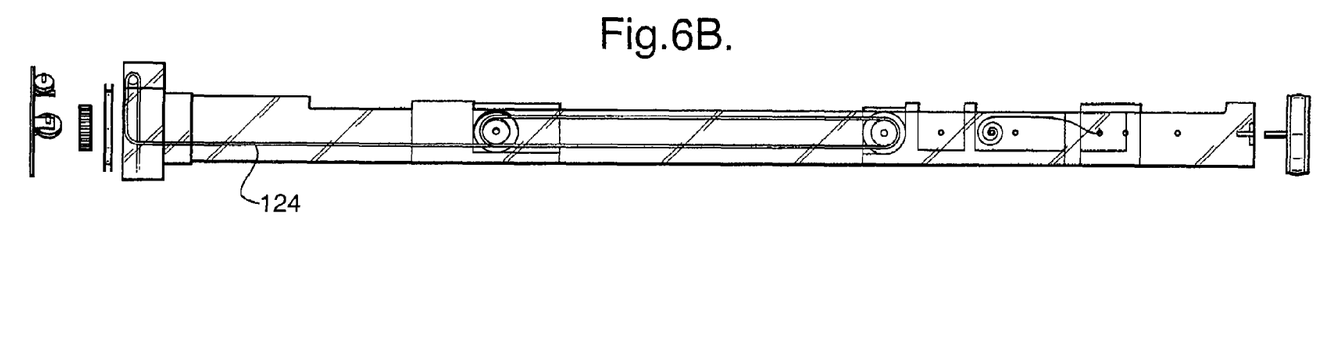
Figure 6C:
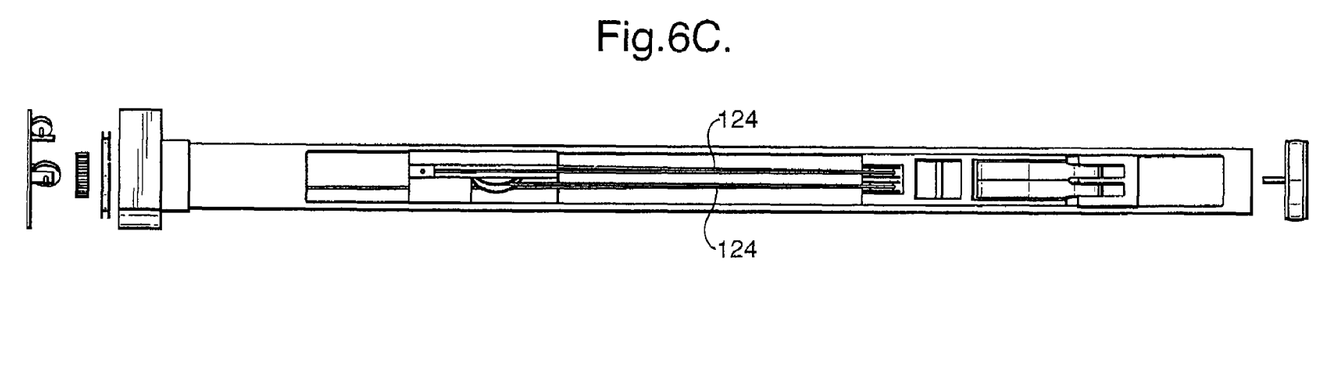

One end of a pulley cable 124 is fixed to the inside of a groove in spool 144 and is then wound around it (the wound cable is shown outside the spool groove in FIG. 5 for clarity). The cable is wound around the two pulleys 134 and 136 inside the housing 114 and then passes through the centre of the cable drum bearing 140. The cable then passes out of the housing 114 through a bore (not visible) into the housing component 126, where it is wound around pulley 128. The cable then passes along the channel in the main body 102 and is wound around the two pulleys 122 of the carriage 118. The end of the cable then passes back along the main body 102 and is fixed to the cable clamp 130. FIGS. 6A to 6C highlight the path of the pulley cable through the apparatus.

The apparatus 100 may include a component that is intended to temporarily fix the position of the rotatable parts of the control apparatus so as to assist during installation. An example of such a device is pin 139 (shown in FIG. 4 only) that passes through the rotatable collar 107 into a suitable aperture in the underlying main body 102.

When the control apparatus and associated blind are installed (or beforehand) the material/dimensions of the blind will be chosen. These properties of the blind can determine the properties of some of the components of the control apparatus that assist with producing a counterbalance effect. The force provided by the constant force springs may be chosen to correspond with the size/weight of the blind material. The dimensions/weight of the pulley cable 124 may be selected in accordance with the weight/dimensions of the blind material. The dimensions/weight of the materials/components used in the control apparatus components will ideally match properties of the blind material (e.g. a blind having a 3 m drop will normally result in a pulley cable having a generally equivalent length of around 3 m; if the thickness of the blind material is 0.76 mm then the diameter of the cable used will be around 0.76 mm), but a variation of around 10% can be tolerated. The blind material 110 is attached to the rotatable shaft 108 and the shaft is fitted onto the control apparatus 100. The apparatus can be fixed to the building structure using any conventional means.

In use after installation, a user pulls the looped chain 109 to raise/lower the blind 110. Pulling the chain 109 rotates the further spool 109A and the shaft 108, thereby increasing or decreasing a portion of the blind material 110 that hangs from the shaft. Lowering the blind increases the amount of material that hangs and thus effectively increases the weight supported by the shaft. The rotation of the shaft also causes the collar 107 to rotate. This results in rotation of the internally housed spool 144 and adjusts the amount of cable 124B that is wound around it (this winding of the cable is illustrated schematically (separate from the spool for clarity) in FIG. 5). This effectively alters the weight at the spool 144 (i.e. the weight will vary in accordance with the amount of cable material wrapped around the spool) so that it can be substantially equivalent to the weight of the portion of the blind that hangs from the shaft 108.

Altering the amount of cable 124B that is wrapped around the spool 144 also shortens/lengthens the amount of the cable that extends between the housing 114 and the moveable carriage 116. The torque exerted by the control apparatus has a magnitude substantially equivalent to that of a generally opposing torque that is applied to the shaft as a result of the weight of the hanging portion of the blind 110, i.e. the force exerted by the constant force springs 120A, 120B acts as a counter-balance substantially equal to the weight of the hanging portion. This arrangement effectively provides a control apparatus that requires little (or virtually no) effort for a user to raise/lower the blind throughout its travel, with the position of the blind being maintained by the counterbalance effect when the user is not pulling the chain 109.

The counterbalance effect operates throughout substantially the entire travel of the blind, from its fully wound position (when substantially none of the blind material that is intended to hang from the shaft depends) through to its fully unwound position (where substantially all of the material that is intended to hang from the shaft depends). It will be understood that in some cases not all of the blind material will hang when the blind is in its fully unwound position (e.g. part of the material may be glued to the shaft and is not intended to hang loosely). Also, in some cases the blind material may be indirectly connected to the shaft, e.g. by means of an elongate tab along one end of the blind.

If in any circumstance the blind needs to be biased to lift or drop under spring pressure, this can easily be achieved by increased pressure of the constant force springs 120. For example, a 1 kilogram increase in spring pressure will equal around 1 kilogram bias on curtain lift throughout its full travel. All or some of the spring housing components 116, 118 may be in the form of cartridges that can easily be replaced in the body of the apparatus. Thus, a set of cartridges having different types of springs could be provided for use with the apparatus.

Although the embodiment described above incorporates pulley wheels and cables, it will be appreciated that other means of achieving the desired effect will be within the capabilities of the skilled person. For example, in a simple embodiment an actual counterbalance weight could be used instead of the spool/pulley mechanism, with the weight hanging and moving up/down to balance the raising/lowering of the blind material. Alternatively, a tape or belt could be used instead of a cable and/or gear boxes could be used.

Although the example described above is intended to work in conjunction with roller blinds, it will be appreciated that the control apparatus can also operate with other types of blinds/coverings, including (but not limited to) Roman blinds, Venetian blinds and festoon blinds. Also, arrangements that include guides for the blind/covering (e.g. vertical tracks that limit swinging movement of hanging blinds) can be used with the control apparatus. Having components of the control system fitted within the main body 102 and/or in a housing located at one end of the body means that the arrangement is relatively compact and should not hinder installation of the blind/control apparatus.

The invention claimed is:

1. A windable covering including a control apparatus for positioning and counterbalancing an amount of flexible blind material wound onto or unwound from a rotatable shaft of the windable covering, the covering including:
   a main body;
   a hollow rotatable shaft in which said main body is at least partially received;
   a flexible blind material secured to and wound onto or unwound from said rotatable shaft; and
   a variable torque device fitted within the main body having a spring and a cable system, said cable system operatively interconnecting said flexible blind material and said spring whereby a variable weight of blind material hanging from said shaft in any position between fully wound and fully unwound is counterbalanced by said spring and cable system to releasably retain said blind material in any said position.

2. The covering of claim 1 wherein the variable torque device includes a first fixed housing and a movable carriage and wherein said spring is a constant force device connecting the movable carriage to the first fixed housing.

3. The covering of claim 2 wherein one, or both, of the first fixed housing and the movable carriage are in the form of a removable cartridge that can be readily replaced by another cartridge having a different type of constant force device that provides a force of a different magnitude.

4. The covering of claim 3 wherein said variable torque device further includes a second fixed housing and wherein said cable system includes a flexible elongate member connected to the second fixed housing, said flexible elongate member being adapted to be wound and unwound about an axis, and a rotatable spool about which said flexible elongate member can be wound and unwound.

5. The covering of claim 4 wherein the flexible elongate member has a length that matches the unwound length of the flexible blind material within 10 percent.

6. The covering of claim 4 wherein the flexible elongate member has a thickness that matches the thickness of the flexible blind material within 10 percent.

* * * * *